(12) United States Patent
Kashefi et al.

(10) Patent No.: US 11,952,655 B2
(45) Date of Patent: Apr. 9, 2024

(54) ELECTROMAGNET PULSING EFFECT ON PVD STEP COVERAGE

(71) Applicant: Applied Materials, Inc., Santa Clara, CA (US)

(72) Inventors: Kevin Kashefi, San Ramon, CA (US); Xiaodong Wang, San Jose, CA (US); Suhas Bangalore Umesh, Sunnyvale, CA (US); Zheng Ju, Sunnyvale, CA (US); Jiajie Cen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/737,361

(22) Filed: May 5, 2022

(65) Prior Publication Data

US 2023/0313364 A1     Oct. 5, 2023

Related U.S. Application Data

(60) Provisional application No. 63/324,944, filed on Mar. 29, 2022.

(51) Int. Cl.
    *H01J 37/34*      (2006.01)
    *C23C 14/34*      (2006.01)
    *C23C 14/35*      (2006.01)

(52) U.S. Cl.
    CPC .......... *C23C 14/351* (2013.01); *C23C 14/345* (2013.01); *C23C 14/3485* (2013.01); *H01J 37/3405* (2013.01); *H01J 37/3458* (2013.01); *H01J 37/3467* (2013.01)

(58) Field of Classification Search
    CPC ............... H01J 37/3458; H01J 37/3405; H01J 37/3467; C23C 14/345; C23C 14/351; C23C 14/3485
    See application file for complete search history.

(56) References Cited

U.S. PATENT DOCUMENTS

| 6,368,469 B1 | 4/2002 | Nulman et al. |
| 6,488,822 B1 | 12/2002 | Moslehi |
| 6,579,421 B1 | 6/2003 | Fu |

(Continued)

OTHER PUBLICATIONS

PCT International Search Report and Written Opinion for PCT/US2022/036071 dated Dec. 22, 2022.

*Primary Examiner* — Michael A Band
(74) *Attorney, Agent, or Firm* — MOSER TABOADA

(57) ABSTRACT

Methods and apparatus for processing a substrate are provided herein. For example, a physical vapor deposition processing chamber comprises a chamber body defining a processing volume, a substrate support disposed within the processing volume and comprising a substrate support surface configured to support a substrate, a power supply configured to energize a target for sputtering material toward the substrate, an electromagnet operably coupled to the chamber body and positioned to form electromagnetic filed lines through a sheath above the substrate during sputtering for directing sputtered material toward the substrate, and a controller operably coupled to the physical vapor deposition processing chamber for controlling the electromagnet based on a recipe comprising a pulsing schedule for pulsing the electromagnet during operation to control directionality of ions relative to a feature on the substrate.

5 Claims, 3 Drawing Sheets

(56) References Cited

U.S. PATENT DOCUMENTS

| | | |
|---|---|---|
| 7,556,718 B2 | 7/2009 | Brcka |
| 9,062,372 B2 * | 6/2015 | Gopalraja ......... H01J 37/32706 |
| 9,887,075 B2 | 2/2018 | Hoyes |
| 11,037,768 B2 | 6/2021 | Wang et al. |
| 2002/0068445 A1 | 6/2002 | Klatt et al. |
| 2002/0068464 A1 | 6/2002 | Forster et al. |
| 2011/0011737 A1 | 1/2011 | Wu et al. |
| 2018/0025895 A1 | 1/2018 | Riker et al. |

* cited by examiner

ELECTROMAGNET PULSING EFFECT ON PVD STEP COVERAGE

CROSS-REFERENCE TO RELATED APPLICATIONS

The present application claims the benefit of and priority to U.S. Provisional Application Ser. No. 63/324,944, filed on Mar. 29, 2022, the entire contents of which is incorporated herein by reference.

FIELD

Embodiments of the present disclosure generally relate to methods and apparatus for processing a substrate, and, for example, to methods and apparatus that use electromagnet (EM) pulsing during physical vapor deposition (PVD) to control ion directionality.

BACKGROUND

Sputtering, also known as physical vapor deposition (PVD), is a method of forming metallic features in integrated circuits. Sputtering deposits a material layer on a substrate. A source material, such as a target, is bombarded by ions strongly accelerated by an electric field. The bombardment ejects material from the target, and the material (e.g., metal) then deposits on the substrate (e.g., create a metal film on a surface of a substrate). The ions are also used to bombard surfaces of the deposited metals to create a good texture for adhesion and densify the film. Ions, however, are easily affected by substrate self-bias and can become directional (vertical) and, thus, increase bottom coverage, while sidewall coverage becomes deficient. Accordingly, sidewall coverage is often difficult to obtain, as compared to bottom coverage in an ionized PVD plasma.

Thus, the inventors have provided improved methods and apparatus for PVD with controlled ion directionality.

SUMMARY

Methods and apparatus for processing a substrate are provided herein. For example, in at least some embodiments, a physical vapor deposition processing chamber comprises a chamber body defining a processing volume, a substrate support disposed within the processing volume and comprising a substrate support surface configured to support a substrate, a power supply configured to energize a target for sputtering material toward the substrate, an electromagnet operably coupled to the chamber body and positioned to form electromagnetic filed lines through a sheath above the substrate during sputtering for directing sputtered material toward the substrate, and a controller operably coupled to the physical vapor deposition processing chamber for controlling the electromagnet based on a recipe comprising a pulsing schedule for pulsing the electromagnet during operation to control directionality of ions relative to a feature on the substrate.

In accordance with at least some embodiments a method for performing physical vapor deposition comprises energizing a target using a power supply for sputtering material toward a substrate disposed on a substrate surface of a substrate support, forming electromagnetic filed lines through a sheath above the substrate using an electromagnet during sputtering for directing sputtered material toward the substrate, and controlling the electromagnet based on a recipe comprising a pulsing schedule for pulsing the electromagnet during operation to control directionality of ions relative to a feature on the substrate.

In accordance with at least some embodiments a non-transitory computer readable storage medium having instructions stored thereon that when executed by a processor perform a method for performing physical vapor deposition. The method comprises energizing a target using a power supply for sputtering material toward a substrate disposed on a substrate surface of a substrate support, forming electromagnetic filed lines through a sheath above the substrate using an electromagnet during sputtering for directing sputtered material toward the substrate, and controlling the electromagnet based on a recipe comprising a pulsing schedule for pulsing the electromagnet during operation to control directionality of ions relative to a feature on the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
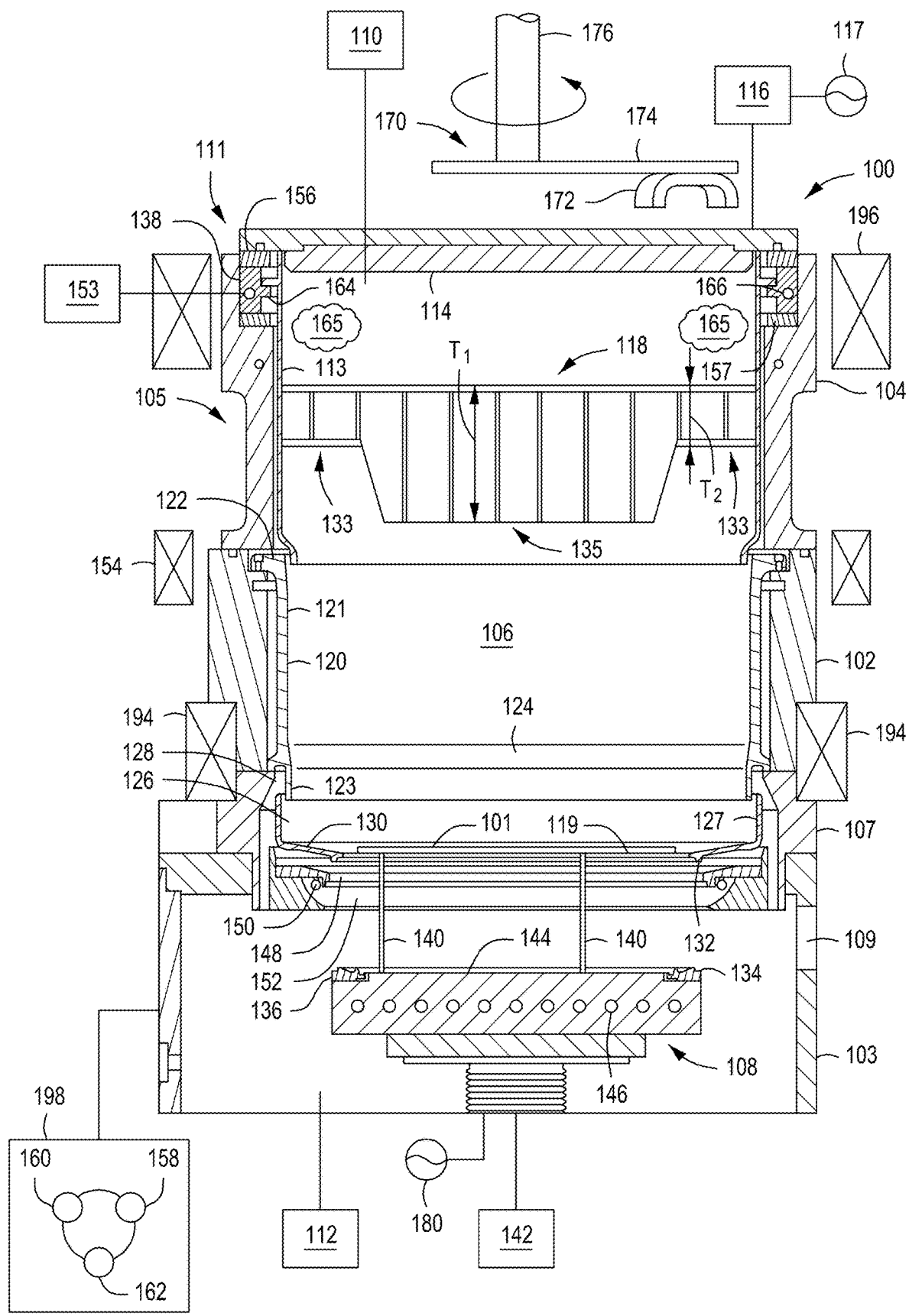
FIG. 1 depicts a schematic cross-sectional view of a processing chamber, in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus that use (EM) pulsing during physical vapor deposition (PVD) to control ion directionality during step coverage are disclosed herein. For example, in at least some embodiments a physical vapor deposition processing chamber can comprise a chamber body defining a processing volume, a substrate support disposed within the processing volume and comprising a substrate support surface configured to support a substrate. A power supply can be configured to energize a target for sputtering material toward the substrate. An electromagnet can be operably coupled to the chamber body for directing sputtered material toward the substrate support, and a controller can be operably coupled to the physical vapor deposition processing chamber for controlling the electromagnet based on a recipe comprising a pulsing schedule for pulsing the electromagnet during operation to control directionality of ions relative to a feature on the substrate.

The inventive methods and apparatus advantageously provide greater control over the ions in PVD processes (e.g., step coverage), thus further advantageously facilitating control over deposition results, such as deposition in features in a substrate. For example, electromagnetic (EM) pulsing can result in agitation of ions at a surface of a substrate, thus effectively widening angular distribution of incident ions as the ions approach a sheath. Accordingly, the effect of the sheath creating a vertical direction of the ions resulting in high bottom coverage and low sidewall coverage is reduced, if not eliminated.

Embodiments of the present disclosure are illustratively described herein with respect to a PVD chamber (or other plasma processing chamber). However, the inventive method may be used in any process chamber modified in accordance with the teachings disclosed herein. FIG. 1 illustrates a process chamber 100 e.g., a sputter process chamber, in accordance with embodiments of the present disclosure, suitable for sputter depositing materials on a substrate having a given diameter. In some embodiments, the PVD chamber further includes a collimator 118 disposed therein and supported by a process tool adapter 138. In the embodiment illustrated in FIG. 1, the process tool adapter 138 is a cooled process tool adapter. Illustrative examples of suitable PVD chambers that may be adapted to benefit from the disclosure include PVD processing chambers commercially available from Applied Materials, Inc., of Santa Clara, California. Other processing chambers available from Applied Materials, Inc. as well as other manufacturers may also be adapted in accordance with the embodiments described herein.

The process chamber 100 generally includes an upper sidewall 102 (e.g., a chamber body), a lower sidewall 103, a ground adapter 104, and a lid assembly 111 defining a body 105 that encloses an interior volume 106 (processing volume). The interior volume 106 includes a central portion having about the given diameter of the substrate to be processed and a peripheral portion surrounding the central portion. In addition, the interior volume 106 includes an annular region above the substrate and proximate a target, wherein an inner diameter of the annular region is substantially equal to or greater than a diameter of the substrate such that a predominant portion of the plasma is disposed in a position both above and radially outward of the substrate.

An adapter plate 107 may be disposed between the upper sidewall 102 and the lower sidewall 103. A substrate support 108 is disposed in the interior volume 106 of the process chamber 100. The substrate support 108 comprises a substrate support surface 119 and is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

In some embodiments, the process chamber 100 is configured to deposit, for example, titanium, aluminum oxide, aluminum, aluminum oxynitride, copper, tantalum, tantalum nitride, tantalum oxynitride, titanium oxynitride, tungsten, or tungsten nitride on a substrate, such as the substrate 101. Non-limiting examples of suitable applications include seed layer deposition in vias, trenches, dual damascene structures, or the like.

A gas source 110 is coupled to the process chamber 100 to supply process gases into the interior volume 106. In some embodiments, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and water ($H_2O$) vapor among others.

A pumping device 112 is coupled to the process chamber 100 in communication with the interior volume 106 to control the pressure of the interior volume 106. In some embodiments, during deposition the pressure level of the process chamber 100 may be maintained at about 1 Torr or less. In some embodiments, the pressure level of the process chamber 100 may be maintained at about 500 mTorr or less during deposition. In some embodiments, the pressure level of the process chamber 100 may be maintained at about 1 mTorr to about 300 mTorr during deposition.

The ground adapter 104 may support a target, such as target 114. The target 114 is fabricated from a material to be deposited on the substrate. In some embodiments, the target 114 may be fabricated from titanium (Ti), tantalum (Ta), tungsten (W), cobalt (Co), nickel (Ni), copper (Cu), aluminum (Al), alloys thereof, combinations thereof, or the like. In some embodiments, the target 114 may be fabricated from copper (Cu), titanium (Ti), tantalum (Ta), or aluminum (Al).

The target 114 may be coupled to a source assembly comprising a power supply 117 for the target 114. In some embodiments, the power supply 117 may be an RF power supply, which may be coupled to the target 114 via a match network 116. In some embodiments, the power supply 117 may alternatively be a DC power source, in which case the match network 116 is omitted. In some embodiments, the power supply 117 may include both DC and RF power sources.

A magnetron 170 is positioned above the target 114. The magnetron 170 may include a plurality of magnets 172 supported by a base plate 174 connected to a shaft 176, which may be axially aligned with the central axis of the process chamber 100 and the substrate 101. The magnets 172 produce a magnetic field within the process chamber 100 near the front face of the target 114 to generate plasma so a significant flux of ions strike the target 114, causing sputter emission of target material. The magnets 172 may be rotated about the shaft 176 to increase uniformity of the magnetic field across the surface of the target 114. Examples of the magnetron include an electromagnetic linear magnetron, a serpentine magnetron, a spiral magnetron, a double-digitated magnetron, a rectangularized spiral magnetron, a dual motion magnetron, among others. The magnets 172 are rotated about the central axis of the process chamber 100 within an annular region extending between about the outer diameter of the substrate to about the outer diameter of the interior volume 106. In general, magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed).

The magnetron 170 may have any suitable pattern of motion wherein the magnets of the magnetron are rotated within an annular region between about the outer diameter of the substrate and the inner diameter of the processing volume. In some embodiments, the magnetron 170 has a fixed radius of rotation of the magnets 172 about the central axis of the process chamber 100. In some embodiments, the magnetron 170 is configured to have either multiple radii or an adjustable radii of rotation of the magnets 172 about the central axis of the process chamber 100. For example, in some embodiments, the magnetron can have a radius of rotation that is adjustable between about 5.5 inches and about 7 inches (for example, for processing a 300 mm substrate). For example, in some embodiments, the magnetron has a dual motion in which the magnets 172 are rotated at a first radius (for example, about 6.7 inches when processing 300 mm substrates) for a first predetermined time period, and at a second radius (for example, about 6.0 inches when processing 300 mm substrates) for a second predetermined time period. In some embodiments the first and second predetermined time periods are substantially equal (e.g., the magnetron is rotated at the first radius for about half of the processing time and at the second radius for about half of the processing time). In some embodiments, the magnetron may rotate at a plurality of radii (e.g., more than just two) that may be discretely set for distinct time periods, or that vary continuously throughout processing.

In operation, the magnets 172 are rotated to form a plasma 165 in the annular portion of the interior volume 106 to sputter the target 114. In at least some embodiments, the plasma 165 may be formed above the peripheral region 133 of the collimator, when the collimator 118 is present to sputter the target 114 above the peripheral region 133. Non-limiting examples of suitable magnetrons that can be modified to rotate at a suitable radius or range of radii in accordance with the present disclosure include the magnetron disclosed in U.S. Pat. No. 8,114,256, issued Feb. 14, 2012 to Chang et al., and entitled "Control of Arbitrary Scan Path of a Rotating Magnetron," and U.S. Pat. No. 9,580,795, issued Feb. 28, 2017 to Miller et al., and entitled "Sputter Source for Use in a Semiconductor Process Chamber."

The process chamber 100 further includes an upper shield 113 and a lower shield 120. In some embodiments, a collimator 118 can be positioned in the interior volume 106 between the target 114 and the substrate support 108. In some embodiments, the collimator 118 has a central region 135 having a thickness $T_1$ and a peripheral region 133 having a thickness $T_2$ less than $T_1$. The central region 135 generally corresponds to the diameter of the substrate being processed (e.g., is equal to or substantially equal to the diameter of the substrate). Thus, the peripheral region 133 generally corresponds to an annular region radially outward of the substrate being processed (e.g., the inner diameter of the peripheral region 133 is substantially equal to or greater than the diameter of the substrate). Alternatively, the central region of the collimator 118 may have a diameter greater than that of the substrate being processed. In some embodiments, the collimator 118 may have a uniform thickness across the whole collimator without separate central and peripheral regions. The collimator 118 is coupled to the upper shield 113 using any fixation means. In some embodiments, the collimator 118 may be formed integrally with the upper shield 113. In some embodiments, the collimator 118 may be coupled to some other component within the process chamber and help in position with respect to the upper shield 113.

In some embodiments, the collimator 118 may be electrically biased to control ion flux to the substrate and neutral angular distribution at the substrate, as well as to increase the deposition rate due to the added DC bias. Electrically biasing the collimator results in reduced ion loss to the collimator, advantageously providing greater ion/neutral ratios at the substrate. A collimator power source (not shown) can be coupled to the collimator 118 to facilitate biasing of the collimator 118.

In some embodiments, the collimator 118 may be electrically isolated from grounded chamber components such as the ground adapter 104. For example, as depicted in FIG. 1, the collimator 118 is coupled to the upper shield 113, which in turn is coupled to the process tool adapter 138. The process tool adapter 138 may be made from suitable conductive materials compatible with processing conditions in the process chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

In some embodiments, a first set of magnets 196 may be disposed adjacent to the ground adapter 104 to assist with generating the magnetic field to guide dislodged ions from the target 114 through the peripheral region 133. The magnetic field formed by the first set of magnets 196 may alternatively or in combination prevent ions from hitting the sidewalls of the chamber (or sidewalls of the upper shield 113) and direct the ions through the collimator 118. For example, the first set of magnets 196 are configured to form a magnetic field having magnetic field lines in the peripheral portion. The magnetic field lines advantageously guide ions through the peripheral portion of the interior volume, and, when present, through the peripheral region 133 of the collimator 118.

In some embodiments, a second set of magnets 194 may be disposed in a position to form a magnetic field between the bottom of the collimator 118 (when used) and the substrate to guide the metallic ions dislodged from the target 114 and distribute the ions more uniformly over the substrate 101. For example, in some embodiments, the second set of magnets may be disposed between the adapter plate 107 and the upper sidewall 102. For example, the second set of magnets 194 are configured to form a magnetic field having magnetic field lines that guide ions toward a feature on a substrate.

In some embodiments, a third set of magnets 154 may be disposed between the first and second set of magnets 196, 194 and about centered with or below a substrate-facing surface of the central region 135 of the collimator 118 to further guide the metallic ions towards the center of the substrate 101. For example, the third set of magnets 154 are configured to create a magnetic field having magnetic field lines directed inward and downward toward the central portion and toward the center of the support surface.

The numbers of the magnets disposed around the process chamber 100 may be selected to control plasma dissociation, sputtering efficiency, and ion control. The first, second, and third sets of magnets 196, 194, 154 may be electromagnets that are configured to guide the metallic ions along a desired trajectory from the target (and in some embodiments through the collimator 118), through a sheath and toward a feature on the substrate support 108. The first, second, and third sets of magnets 196, 194, 154 may be stationary or moveable to adjust the position of a set of magnets in a direction parallel to a central axis of the chamber. In at least some embodiments, one or more of the first, second, and third sets of magnets 196, 194, 154 may be permanent magnets configured to facilitate guiding the metallic ions along a desired trajectory from the target (and in some embodiments through the collimator 118) and toward a feature on the substrate support 108. The exact configuration electromagnet and permanent magnets of the first, second, and third sets of magnets 196, 194, 154 can be based on user needs, type of plasma process, manufacturer preference, etc.

An RF power source 180 may be coupled to the process chamber 100 through the substrate support 108 to provide a bias power between the target 114 and the substrate support 108. In some embodiments, the RF power source 180 may have a frequency between about 400 Hz and about 60 MHz, such as about 13.56 MHz. In some embodiments, the third set of magnets 154 may be excluded and the bias power used to attract the metallic ions towards the center of the substrate 101.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113. In some embodiments, the mounting ring or shelf 164 is a continuous ring about the inner diameter of the process tool adapter 138 to facilitate more uniform thermal contact with the upper shield 113 mounted to the process tool adapter 138.

In some embodiments, a coolant channel 166 may be provided in the process tool adapter 138 to facilitate flowing a coolant through the process tool adapter 138 to remove heat generated during processing. For example, the coolant channel 166 may be coupled to a coolant source 153 to provide a suitable coolant, such as water. The coolant channel 166 advantageously removes heat from the process tool (e.g., the collimator 118) that is not readily transferred to other cooled chamber components, such as the ground adapter 104. For example, the insulator rings 156, 157 disposed between the process tool adapter 138 and the ground adapter 104 are typically made from materials with poor thermal conductivity. Thus, the insulator rings 156, 157 reduce the rate of heat transfer from the collimator 118 to the ground adapter 104 and the process tool adapter 138 advantageously maintains or increases the rate of cooling of the collimator 118. In addition to the coolant channel 166 provided in the process tool adapter 138, the ground adapter 104 may also include a coolant channel to further facilitate removing heat generated during processing.

A radially inwardly extending ledge (e.g., the mounting ring, or shelf 164) is provided to support the upper shield 113 within the central opening within the interior volume 106 of the process chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, the lower shield 120 may be provided in proximity to the collimator 118 and interior of the ground adapter 104 or the upper sidewall 102. The collimator 118 includes a plurality of apertures to direct gas and/or material flux within the interior volume 106. The collimator 118 may be coupled to the collimator power source via the process tool adapter 138.

The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the process chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown). Thus, the substrate 101 may be centered within the process chamber 100 and the shield ring 126 may be centered radially about the substrate 101 during processing.

A controller 198 is coupled to the process chamber 100. The controller 198 includes a central processing unit 160, a memory 158 (non-transitory computer readable storage medium), and support circuits 162. The controller 198 is utilized to control the process sequence, regulating the gas flows from the gas source 110 into the process chamber 100 and controlling ion bombardment of the target 114. The central processing unit 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the central processing unit 160 and may comprise cache, clock circuits, input/output subsystems, power supplies, and the like. The software routines, when executed by the central processing unit 160, transform the central processing unit into a specific purpose computer (e.g., a controller 198) that controls the process chamber 100 such that the processes, including the plasma ignition processes disclosed below, are performed in accordance with embodiments of the present disclosure. The software routines may also be stored and/or executed by a second controller (not shown) that is located remotely from the process chamber 100.

Figures 2A, 2B:
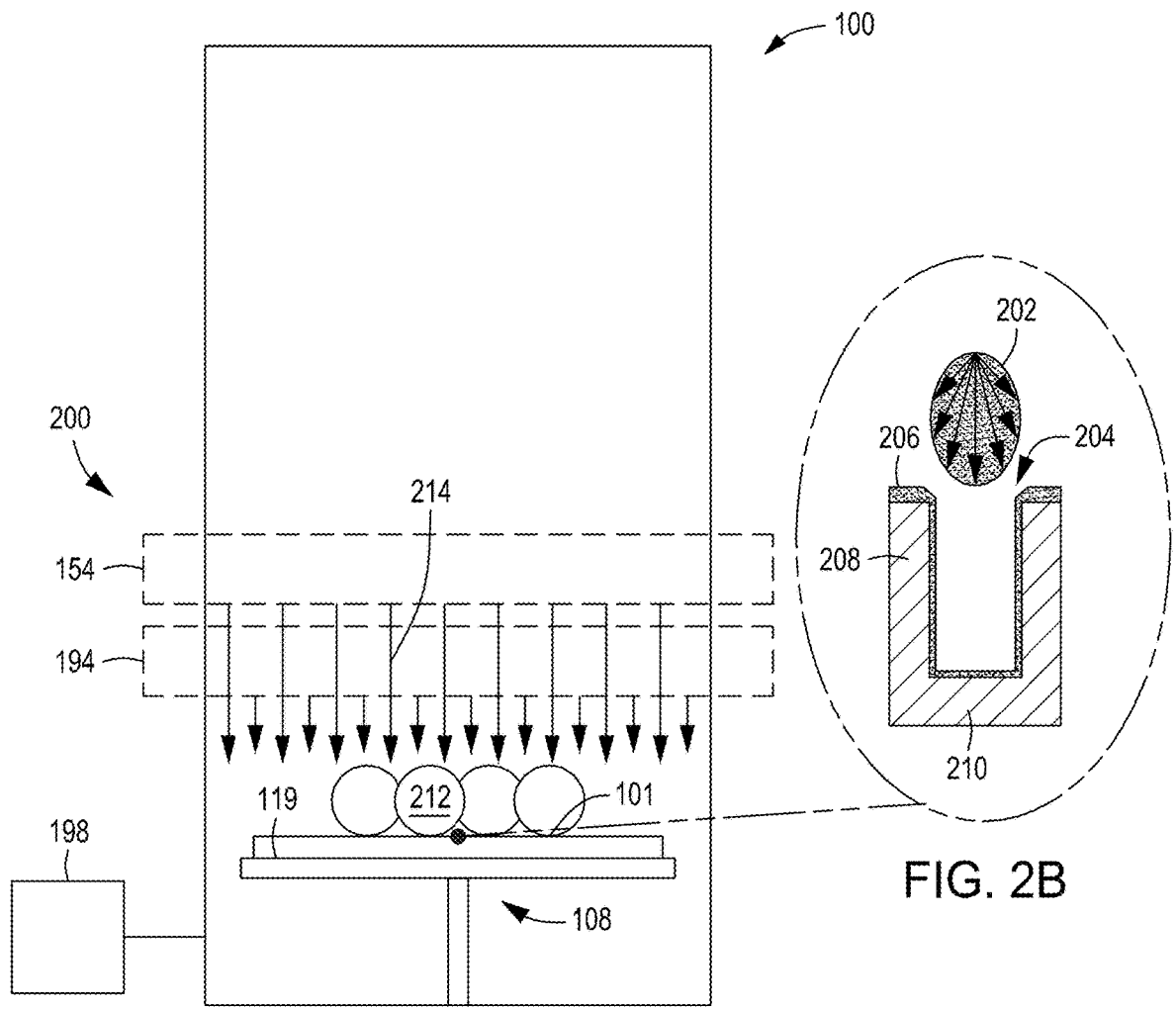
FIG. 2A is a diagram of an electromagnetic configuration configured for use with the processing chamber of FIG. 1, in accordance with some embodiments of the present disclosure.
FIG. 2B is an enlarged area of detail 2B of FIG. 2A, in accordance with some embodiments of the present disclosure.
Figure 3:
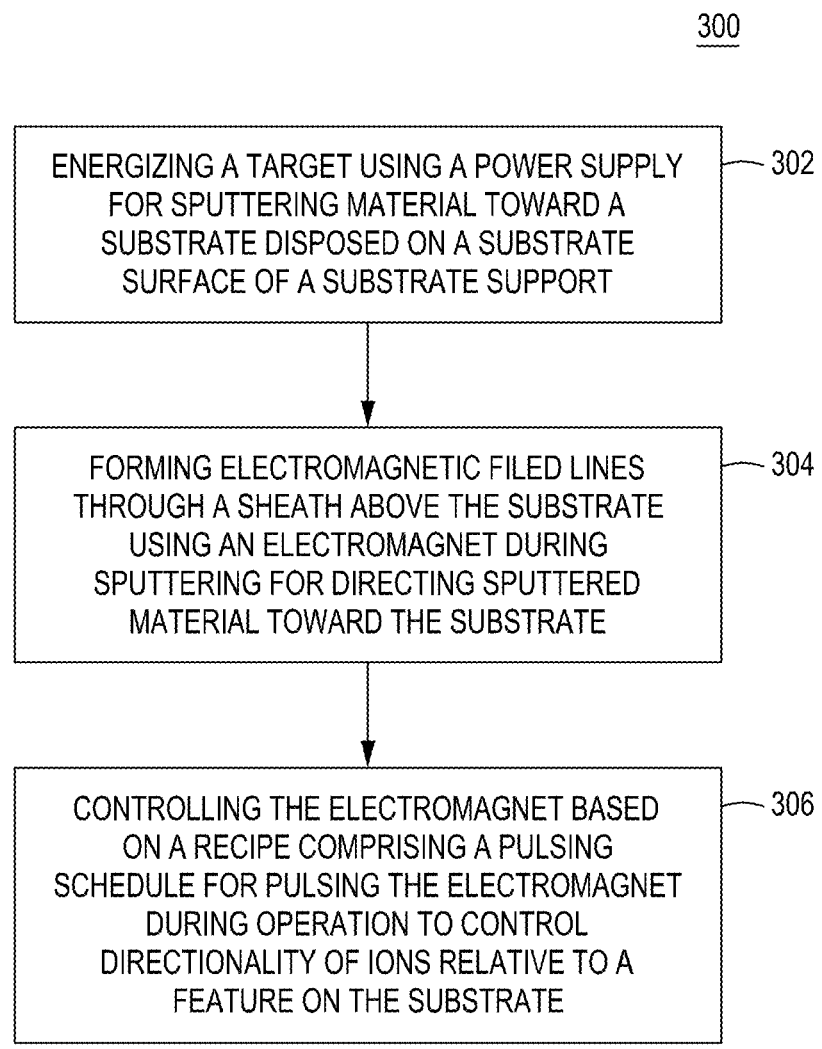
FIG. 3 is a flowchart depicting a method of processing a substrate in accordance with some embodiments of the present disclosure.

FIG. 2A is a diagram of an electromagnetic configuration 200 configured for use with the processing chamber of FIG. 1, FIG. 2B is an enlarged area of detail 2B of FIG. 2A, and FIG. 3 is a flowchart depicting a method 300 of processing a substrate in accordance with some embodiments of the present disclosure.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108.

With the substrate 101 positioned on the substrate receiving surface 144 of the substrate support 108, sputter deposition may be performed on the substrate 101. In at least some embodiments, during sputter deposition, the temperature of the substrate 101 may be controlled by utilizing thermal control channels 146 disposed in the substrate support 108.

During processing, material is sputtered from the target 114 and deposited on the surface of the substrate 101. For example, ions from the plasma 165 can be accelerated toward and strike the target 114, causing target material to be dislodged from the target 114. The dislodged target material and process gases forms a layer on the substrate 101 with desired compositions. Accordingly, at 302, the method 300 comprises energizing a target using a power supply for sputtering material toward a substrate disposed on a substrate surface of a substrate support. For example, in at least some embodiments, the power supply 117 can be DC power source configured to provide power to the target 114. For example, the DC power source can be configured to provide about 0 kW to about 100 kW to the target 114 during sputtering. In at least some embodiments the DC power source can be configured to provide about 1 kW to about 100 kW (e.g., about 25 kW).

As noted above, the inventive methods and apparatus advantageously provide greater control over ions in PVD processes. For example, EM pulsing can result in agitation of ions at a surface of a substrate, thus effectively widening angular distribution 202 (see FIG. 2B, for example) of incident ions as the ions approach a sheath. Accordingly, the effect of the sheath creating a vertical direction of the ions resulting in high bottom coverage and low sidewall coverage is reduced, if not eliminated. In at least some embodiments, the method 300 can be used tantalum nitride (TaN) step coverage improvement, as descried below.

Accordingly, next, at 304, the method 300 comprises forming electromagnetic filed lines through a sheath above the substrate using an electromagnet during sputtering for directing sputtered material toward the substrate. For example, as noted above, the first set of magnets 196, the second set of magnets 194, and/or the third set of magnets 154 can be configured as electromagnets or permanent magnets. In at least some embodiments, the first set of magnets 196 can be configured as a permanent magnet and used to facilitate guiding the metallic ions along a desired trajectory from the target (and in some embodiments through the collimator 118 when used) and toward a feature 204 on the substrate 101. Additionally, the second set of magnets 194 (e.g., a first or bottom magnet) and the third set of magnets 154 (e.g., a second or top magnet) can be EM magnets. The second set of magnets 194 and/or the third set of magnets 154 can be coupled to the upper sidewall 102 and positioned to form electromagnetic filed lines through a sheath 212 above the substrate 101 during sputtering for directing sputtered material toward the substrate (see FIG. 2B, for example). In at least some embodiments, the third set of magnets 154 can be positioned above the second set of magnets 194 and each of the third set of magnets 154 and the second set of magnets 194 can form magnetic field lines 214 through the sheath 212 above the substrate 101.

In at least some embodiments, one or more of the first set of magnets 196, the second set of magnets 194, and/or the third set of magnets 154 can be disposed beneath the processing chamber 100, under the substrate support, or at other specific locations along the processing chamber 100.

Next, at 306, the method 306 comprises controlling the electromagnet based on a recipe comprising a pulsing schedule for pulsing the electromagnet during operation to control directionality of ions relative to a feature on the substrate. For example, in at least some embodiments, a pulse to the third set of magnets 154 and the second set of magnets 194 can be one of a sinusoidal wave, non-sinusoidal wave, or a square wave. In at least some embodiments, the controller 198 can be configured to use a recipe stored in the memory 158 for controlling the third set of magnets 154 and/or the second set of magnets 194. For example, based on the pulsing schedule, the controller 195 can be configured to supply current to the third set of magnets 194 from about −25 A to about 25 A (e.g., about −23.6 A to about 23.6) and supply current to the second set of magnets from about −25 A to about 25 A (e.g., about −8.75 A to about 8.75 A). In at least some embodiments, during a pulse the third set of magnets can be supplied current from about −23.6 A to about −5.6 A, and in at least some embodiments, from about 5.6 A to about 23.6 A. In at least some embodiments, during a pulse the second set of magnets can be supplied current from about −8.75 A to about −0.75 A, and in at least some embodiments, from about 0.75 A to about 8.75 A. Additionally, in at least some embodiments, a frequency of a pulse transmitted to the third set of magnets 154 and the second set of magnets 196 can be about 0 Hz to about 2000 Hz (e.g., about 0 Hz to about 50 Hz) and a frequency of a pulse transmitted the second electromagnet is about 0 Hz to about 2000 Hz (e.g., about 2 Hz to about 50 Hz). The inventors have found that controlling ion directionality during TaN step coverage using the pulsing schemes described herein improves overhang and a ratio of sidewall coverage to bottom coverage with relatively low-k damage.

In at least some embodiments, the method 300 can comprise providing an AC bias power to the substrate support. For example, the target 114 and the substrate support 108 can be biased relative to each other by the power supply 117 and/or the RF power source 180 to maintain a plasma formed from the process gases supplied by the gas source 110. Additionally, in some embodiments, a DC pulsed bias power can be applied to the collimator 118 (when used) to assist controlling ratio of the ions and neutrals passing through the collimator 118, advantageously enhancing the trench sidewall and bottom fill-up capability. Thus, the method 300 can comprise providing at at least one of a center of the substrate support 108 or an edge of the substrate support 108 the AC bias power. In at least some embodiments, the AC bias power can from about zero W to about 1000 W (e.g., about zero W to about 150 W).

After 306, a ratio of sputtered material 206 deposited on a sidewall 208 of the feature 204 and a bottom 210 of the feature 204 without the AC bias power is about 0.65 to about 0.67 and a ratio of sputtered material deposited on the sidewall and the bottom of the feature on the substrate with the AC bias power is about 0.36 to about 0.38. That is, compared to conventional methods and apparatus, the methods and apparatus described herein reduce, if not eliminate, the effect of the sheath creating a vertical direction of the ions, which can result in high bottom coverage and low sidewall coverage (see FIG. 2B for example, which shows the desired angular distribution 202 of the ions and coverage of the sputtered material on the sidewall 208 and the bottom 210). In at least some embodiments, the methods and apparatus described herein can provide about 30% more sidewall coverage than bottom coverage with pulsing, as compared to without pulsing.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (e.g., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to the coolant source 153 to control the temperature of the adapter plate 107 during heating.

After controlling the substrate 101 to a predetermined temperature, the substrate 101 is lowered to a position on the substrate receiving surface 144 of the substrate support 108. The substrate 101 may be rapidly cooled utilizing the thermal control channels 146 in the substrate support 108 via conduction. The temperature of the substrate 101 may be ramped down from the first temperature to a second temperature in a matter of seconds to about a minute. The substrate 101 may be removed from the process chamber 100 through the substrate transfer port 109 for further processing. The substrate 101 may be maintained at a predetermined temperature range, such as less than 250 degrees Celsius.

Thereafter, the substrate 101 can be extended through the substrate transfer port 109 via the robot blade.

While the foregoing is directed to embodiments of the present disclosure, other and further embodiments of the disclosure may be devised without departing from the basic scope thereof.

The invention claimed is:

1. A physical vapor deposition processing chamber, comprising:
   a chamber body defining a processing volume;
   a substrate support disposed within the processing volume and comprising a substrate support surface configured to support a substrate, wherein an RF power source is configured to provide an AC bias power of greater than zero up to about 1000 W to the substrate support;
   a power supply configured to energize a target when disposed in the processing volume for sputtering material toward the substrate;
   a collimator;
   a first electromagnet disposed above the collimator;
   a second electromagnet that is disposed below the first electromagnet;
   a third electromagnet between the first electromagnet and the second electromagnet;
   the second electromagnet and third electromagnet operably coupled to the chamber body and positioned to form electromagnetic field lines through a sheath above the substrate during sputtering for directing sputtered material toward the substrate; and
   a controller operably coupled to the physical vapor deposition processing chamber and programmed to control the second electromagnet and the third electromagnet based on a recipe comprising a pulsing schedule to the second electromagnet and the third electromagnet to supply a current to the third electromagnet different from a current to the second electromagnet, wherein the current to the second electromagnet is about −25 A to about 25 A with a frequency of a pulse being about 0 Hz to about 2000 Hz, and the current to the third electromagnet being about −25 A to about 25 A with a frequency of a pulse being about 0 Hz to about 2000 Hz, resulting in agitation of ions at a surface of the substrate to widen angular distribution of incident ions as ions approach the sheath and to control the ions relative to a feature on the substrate to improve overhang and increase coverage of sputtered material from the target on a sidewall of the feature relative to a bottom of the feature, wherein a ratio of sputtered material deposited on the sidewall of the feature and the bottom of the feature without the AC bias power is greater than a ratio of sputtered material deposited on the sidewall and the bottom of the feature on the substrate with the AC bias power.

2. The physical vapor deposition processing chamber of claim 1, wherein the controller is further programmed to control the second electromagnet and the third electromagnet so that the ratio of sputtered material deposited on the sidewall of the feature and the bottom of the feature without the AC bias power is about 0.65 to about 0.67 and the ratio of sputtered material deposited on the sidewall and the bottom of the feature on the substrate with the AC bias power is about 0.36 to about 0.38.

3. The physical vapor deposition processing chamber of claim 1, wherein the power supply is a DC power source configured to provide about zero to about 100 kW during sputtering.

4. The physical vapor deposition processing chamber of claim 1, wherein the pulsing schedule comprises a plurality of pulses to be transmitted to the electromagnet in one of a sinusoidal wave, a non-sinusoidal wave, or a square wave.

5. The physical vapor deposition processing chamber of claim 1, wherein the current to the second electromagnet is about −8.75 A to about −0.75 A and the current to the third electromagnet is about 5.6 A to about 23.6 A.

* * * * *